(12) United States Patent
Zafrani

(10) Patent No.: US 7,489,490 B2
(45) Date of Patent: Feb. 10, 2009

(54) CURRENT LIMITING MOSFET STRUCTURE FOR SOLID STATE RELAYS

(75) Inventor: Maxime Zafrani, Swampscott, MA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/759,354

(22) Filed: Jun. 7, 2007

(65) Prior Publication Data

US 2007/0284672 A1 Dec. 13, 2007

Related U.S. Application Data

(60) Provisional application No. 60/811,537, filed on Jun. 7, 2006.

(51) Int. Cl.
*H02H 9/02* (2006.01)
*G05F 5/00* (2006.01)
*H01L 27/07* (2006.01)

(52) U.S. Cl. .................. 361/93.1; 361/93.9; 361/98; 361/111; 327/521; 327/566; 327/581; 257/378; 257/401

(58) Field of Classification Search ............. 361/93.1, 361/93.9, 98, 111, 378, 401; 327/521, 566, 327/581; 257/378, 401
See application file for complete search history.

(56) References Cited

U.S. PATENT DOCUMENTS

| | | | | | |
|---|---|---|---|---|---|
| 3,553,541 | A | * | 1/1971 | King | 327/432 |
| 4,366,522 | A | * | 12/1982 | Baker | 361/91.7 |
| 4,800,299 | A | * | 1/1989 | Hayward | 327/509 |
| 5,079,608 | A | * | 1/1992 | Wodarczyk et al. | 257/355 |
| 5,132,566 | A | * | 7/1992 | Denda | 326/84 |
| 5,422,509 | A | * | 6/1995 | Zambrano | 257/378 |
| 5,523,607 | A | * | 6/1996 | Zambrano | 257/378 |
| 5,585,287 | A | * | 12/1996 | Zambrano | 438/236 |
| 6,054,845 | A | * | 4/2000 | Feldtkeller | 323/277 |
| 6,055,149 | A | * | 4/2000 | Gillberg et al. | 361/103 |
| RE37,778 | E | * | 7/2002 | Feldtkeller | 323/277 |
| 6,445,144 | B1 | * | 9/2002 | Wuidart et al. | 315/310 |
| 2005/0226016 | A1 | * | 10/2005 | Khaykin et al. | 363/123 |

* cited by examiner

*Primary Examiner*—Evan Pert
(74) *Attorney, Agent, or Firm*—Ostrolenk, Faber, Gerb & Soffen, LLP

(57) ABSTRACT

A current-limiting circuit for limiting rising of a current above a predetermined level. The circuit including forward- and reverse-conducting devices, each device including a MOS and a bipolar transistor, wherein ON-resistance of one of the devices is used instead of a current-sensing resistance for another of the devices; and a gate driver connected to the gates of the forward- and reverse-conducting devices for controlling the devices such that a channel of each of the devices simultaneously conducts a current.

13 Claims, 4 Drawing Sheets

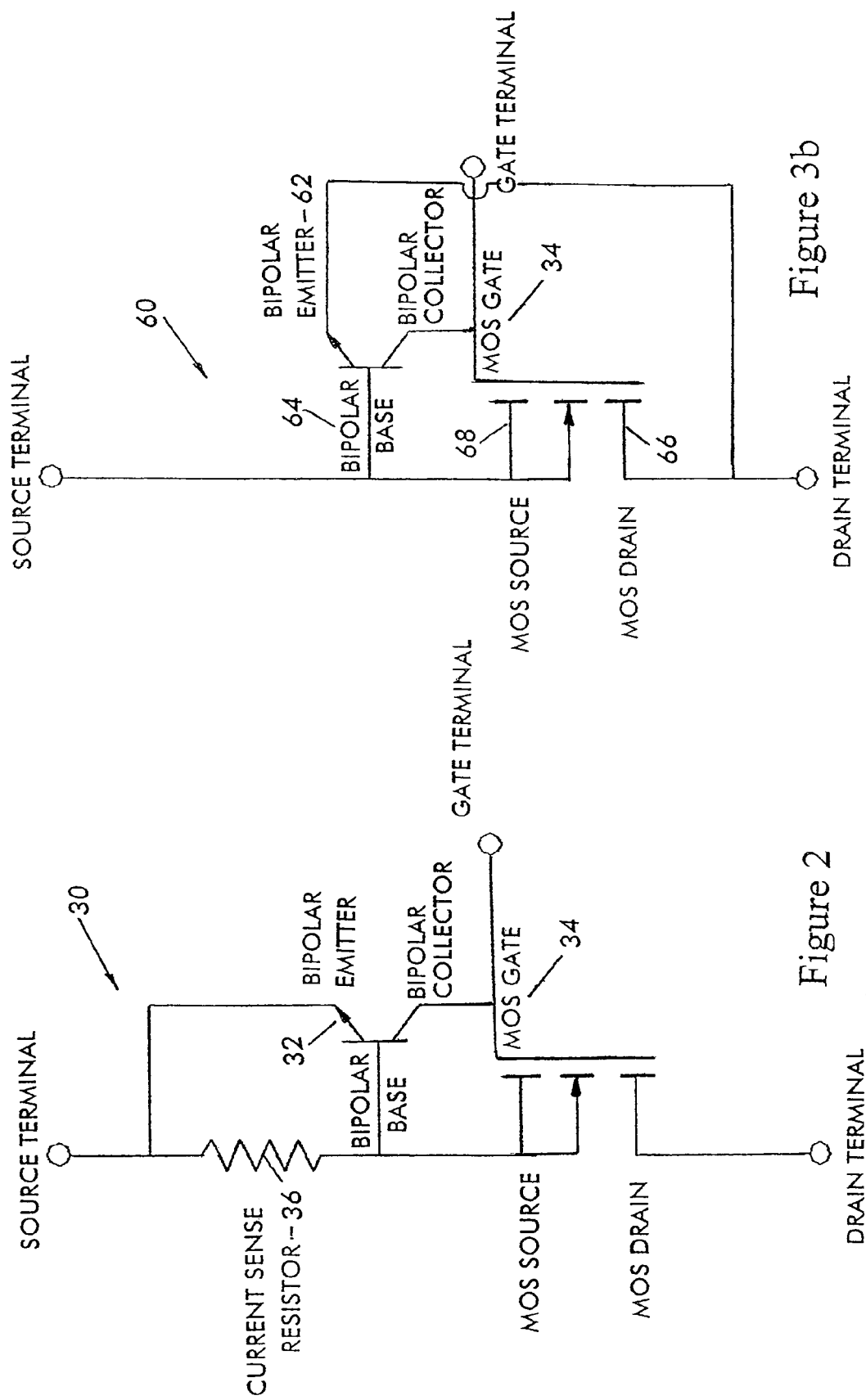

US 7,489,490 B2

CURRENT LIMITING MOSFET STRUCTURE FOR SOLID STATE RELAYS

CROSS-REFERENCE TO RELATED APPLICATION

This application is based on and claims priority to U.S. Provisional Patent Application Ser. No. 60/811,537, filed on Jun. 7, 2006 and entitled IMPROVED CURRENT LIMITING MOSFET STRUCTURE FOR SOLID STATE RELAYS, the entire disclosure of which is hereby incorporated by reference.

BACKGROUND OF THE INVENTION

The present invention relates to eliminating a current sensing resistor across the base to emitter junction of a bipolar transistor so as to limit circuits for removal of a gate drive signal when the drain current is too high while preventing the current from going any higher.

Today, integral current-limiting circuits are widely used with power MOSFET devices. One of the primary reasons for incorporating the current-limiting circuits is to provide protection for the power MOSFET devices in the event of a shorted load. The shorted load might otherwise allow the current to rise high enough to destroy the power MOSFET devices before fault sensing circuitry can detect and interrupt the fault.

FIG. 1 illustrates a MOSFET device 10 having a metal-oxide semiconductor (MOS) and a bipolar transistor, that is commonly used in power MOSFET devices, formed on a silicon substrate. A current flow through the MOS is sensed by a current-sensing resistor 12 across a base-to-emitter junction of the bipolar transistor. The bipolar transistor having a collector 18, an emitter 16, and a base 14 and the MOS having a gate 15, a drain 17, and a source 19. The collector 18 is tied to the gate 15 of the MOS that includes a terminal 20 formed on a gate metal 24. The emitter 16 is tied to the source 19 of the MOS that includes a source terminal 22 formed on a source metal 26. The bipolar transistor of the power MOSFET device 10 further includes a base 14.

When the voltage drop on the sense-resistor 12 reaches a voltage value $V_{BE}$ of the bipolar transistor of about 0.7 to 0.8 volt, the bipolar transistor becomes conductive and removes enough of the drive signal from the MOS gate 20 to prevent the current from rising any higher. One of the disadvantages of the power MOSFET device 10 is in that the resistance of the sense resistor 12 must be high enough to produce about 0.7 to 0.8 volt at the current-limiting level. And this resistance of the sense resistor 12 is directly in series with the MOSFET ON-resistance, resulting in increased power dissipation during conduction.

Many applications exist, which, as shown in FIG. 2, connect the two described devices, a bipolar transistor 32 and a MOS 34, back-to-back, forming a bi-directional current-limiting switch 30 to control an alternating current. FIG. 2 only shows one device. A disadvantage of such circuit 30 is in that the load current must always flow through two in series sense resistors 36, further increasing the power dissipation.

What is needed is a way to remove some of the gate drive signal when the drain current is too high, so as to prevent the current from going any higher, while eliminating use of a current sensing resistor across the base to emitter junction of a bipolar transistor required in available current limiting circuits.

SUMMARY OF THE INVENTION

It is an object of the present invention to provide a current limiting circuit that eliminates use of a current sensing resistor.

It is an object of the present invention to add to the rdsON of the power MOSFET device and increase its power dissipation during a conduction mode.

A current-limiting circuit is provided for limiting rising of a current above a predetermined level. The circuit including forward- and reverse-conducting devices, each device including a MOS and a bipolar transistor, wherein ON-resistance of one of the devices is used instead of a current-sensing resistance for another of the devices; and a gate driver connected to the gates of the forward- and reverse-conducting devices for controlling the devices such that a channel of each of the devices simultaneously conducts a current.

Other features and advantages of the present invention will become apparent from the following description of the invention that refers to the accompanying drawings.

BRIEF DESCRIPTION OF THE DRAWINGS

FIG. 2 is a diagram of a bi-directional current-limiting switch for control of alternating current formed from the two devices of FIG. 1;

FIG. 3b is a circuit diagram of the current limiting device of FIG. 3a; and

DETAILED DESCRIPTION OF EMBODIMENTS OF THE INVENTION

Figure 1:
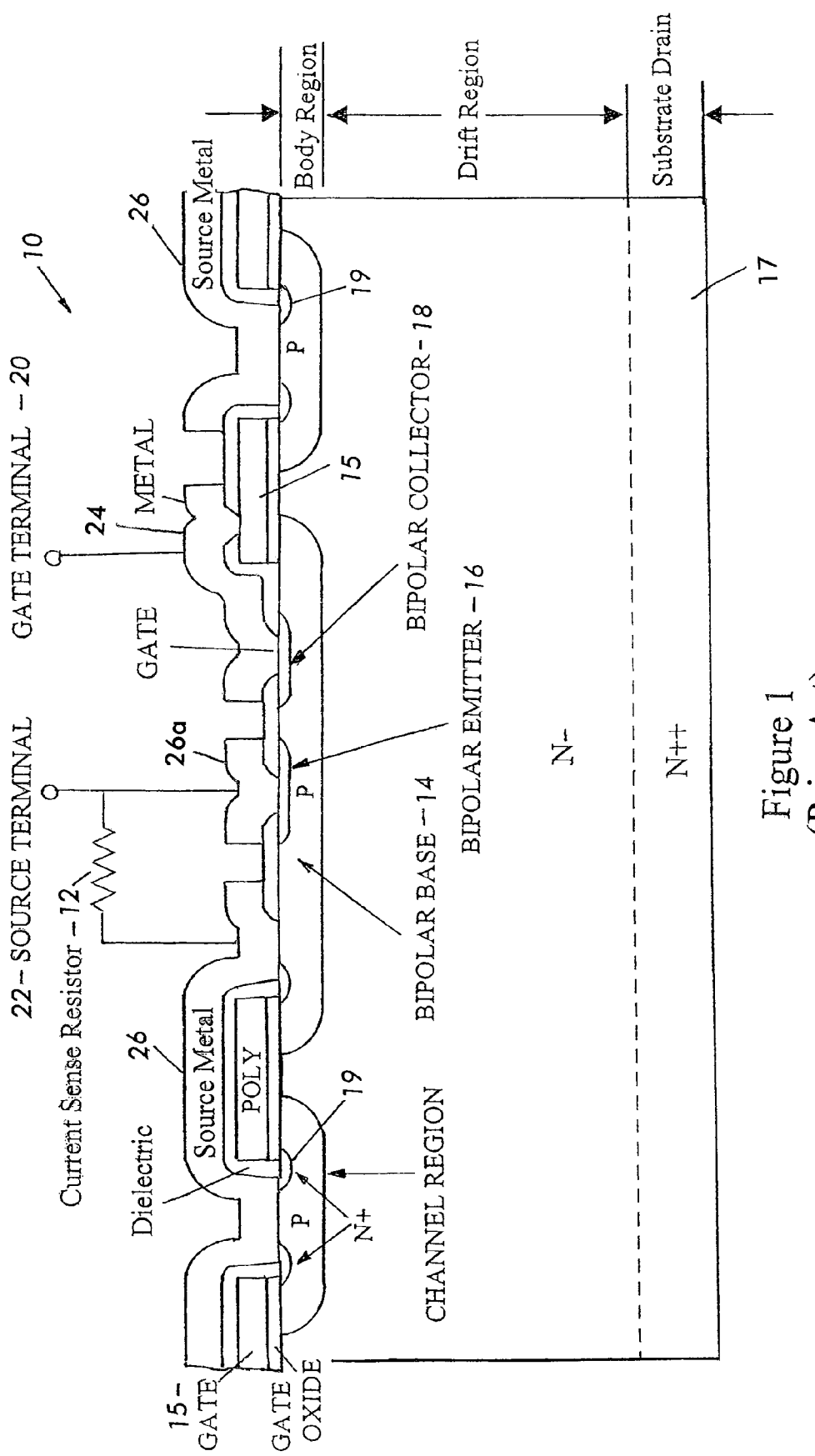
FIG. 1 is a diagram of a MOS and a bipolar transistor formed on a silicon substrate and commonly used in power MOSFET devices.
Figure 3A:
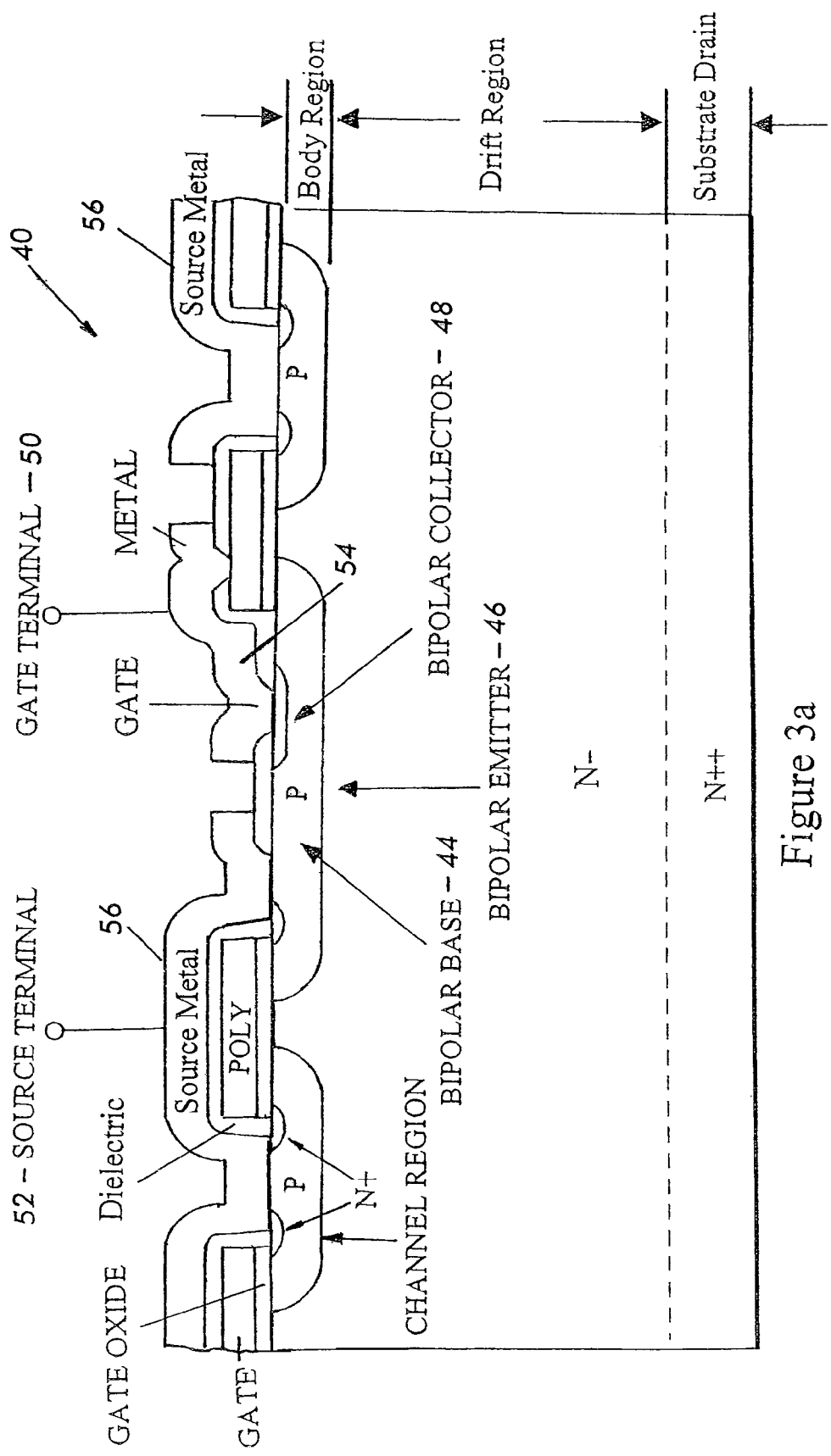
FIG. 3a is a diagram of a current limiting device of an embodiment of the present invention.

FIG. 3a illustrates a MOSFET device 40, in which the current sensing resistors have been completely eliminated, thereby eliminating that portion of the power dissipation. Also eliminated is the source metal area 26a (FIG. 1) of the MOSFET device 10, while the emitter 46 is the same as the drift region of the substrate, which is the drain of the MOS. The MOSFET device 40 further includes a collector 48 tied to a MOS gate having a gate terminal 50 formed on a gate metal 54. The MOSFET device 40 source metal 56. further includes a base 44 and a MOS source having a source terminal 52 formed on a Thus, the MOSFET device 40 still contains the bipolar transistor to perform the current-limiting function, but the bipolar transistor in one MOSFET device 40 performs current limiting functions for another MOSFET device 40, instead of for itself as in the MOSFET device 10 (FIG. 1). In the configuration illustrated in FIG. 3a, the ON-resistance of one MOSFET device 40 serves as the current-sensing resistance for another MOSFET device 40, thereby eliminating the separate sense-resistors required in the design of the MOSFET device 10.

As illustrated in the circuit diagram of FIG. 3b, the emitter 62 of the bipolar transistor 64 has been connected to the drain 66, rather than to the source 68, of the MOS 70. The result is that the bipolar transistor of the MOSFET device 60 then turns on when the MOS 70 carries a reverse current, rather than a forward current. This also means that the emitter-base junction of the bipolar transistor 64 of the MOSFET device 60 must support a full applied drain voltage of the MOS 70 when the MOS 70 is in the blocking state. The bipolar transistor of the MOSFET device 60 is able to do this because, as can be seen in FIG. 3a, the emitter-base junction of the bipolar transistor of the MOSFET device 40 is the body-drain junction of the MOSFET. The bipolar transistor of the MOSFET device 60 is a vertical, rather than a lateral bipolar transistor as in the MOSFET device 10 of FIG. 1.

Since, in the MOSFET device of FIG. 3a, the emitter of the bipolar transistor is beneath its collector, the surface area occupied by the emitter in the prior design, e.g., FIG. 1, can be utilized to increase the active area, or to reduce the total area of the MOSFET device. Additional area efficiency results from the elimination of the current-sense resistor, and from the elimination of separate source pads. As shown in FIG. 1, a separate source pad was required to isolate the source terminal 22 from the active source area metal 26a, in order to force the current to flow through the sense-resistor 12 before it reaches the active area. In the MOSFET device 40 of FIG. 3a, the source terminal can be placed directly on the active source area, rather than on an inactive source pad, because the active area is the sense resistor.

Figure 4:
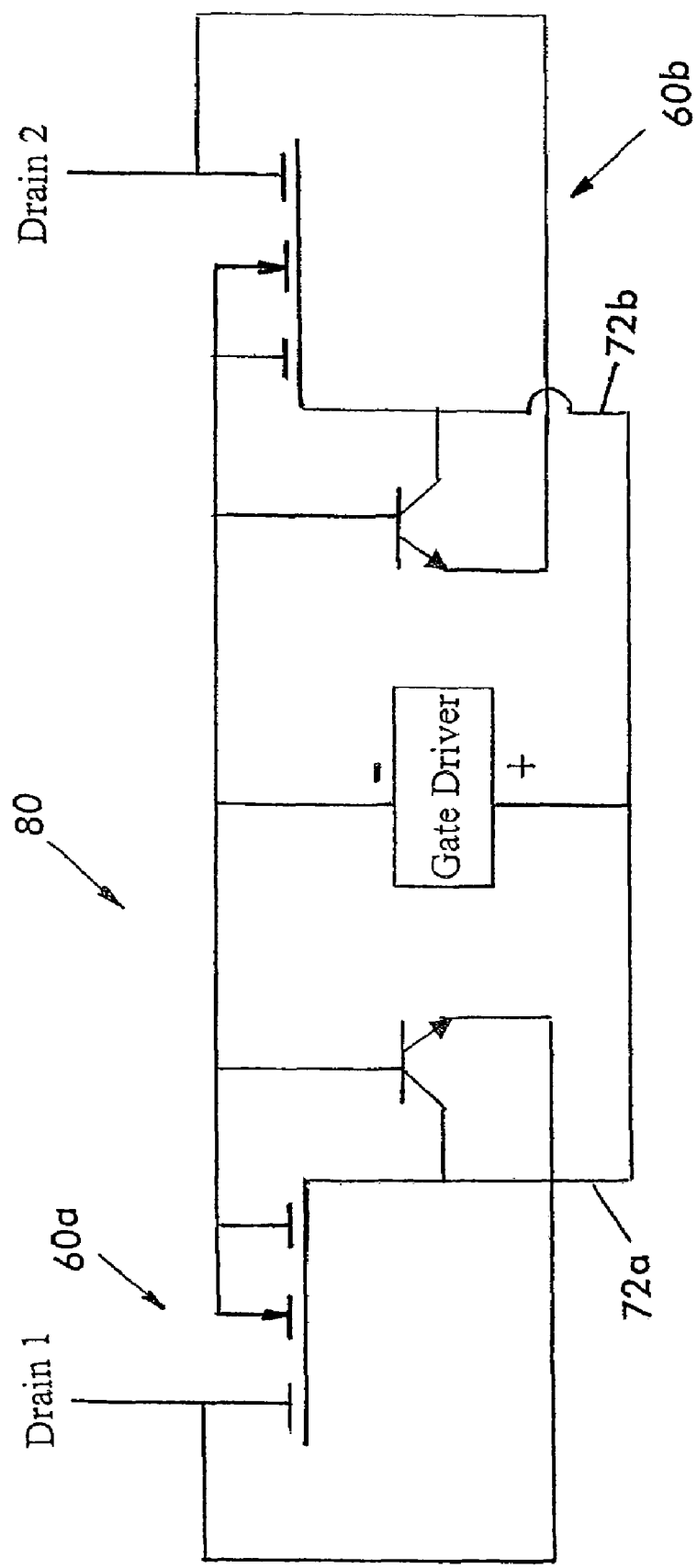
FIG. 4 is a circuit diagram of two back to back current limiting devices of FIGS. 3a and 3b.

When two MOSFET devices 60 are operated back-to-back as in a circuit 80 of FIG. 4, both gates 72a and 72b are energized by the same gate driver, so the channels in both MOSFET devices 60a and 60b are simultaneously conducting. The same current flows through both devices 60a and 60b in series, as forward current for one, and reverse current for the other.

In reverse conduction, nearly all the current flows through the channel until the voltage drop on the channel reaches 0.7 to 0.8 volts, at which point the channel begins to forward bias the body-drain junction, which also functions as the emitter-base junction of the bipolar transistor, causing buildup of a plasma of holes and electrons in the N-drain region.

Electrons from this plasma diffuse into the P base 44 and are collected by its N+ collector region 48, which is tied to the gate electrode 50 of both MOSFETs. This current is directed to de-bias the gates, so it clamps the gate voltage at this level and keeps the forward-conducting MOSFET from allowing the current to go any higher. In other words, current through the reverse-conducting MOSFET limits the current by controlling the gate voltage of the forward-conducting MOSFET.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A current-limiting circuit for limiting rising of a current above a predetermined level, the circuit comprising:
    forward- and reverse-conducting devices, each device including a MOS transistor and a bipolar transistor, wherein ON-resistance of the MOS transistor of one of the devices is used as a current-sensing resistance for the other of the devices to turn on the bipolar transistor of the one of the devices to thereby limit the current in the other device; and
    a gate driver connected to the gates of the forward- and reverse-conducting devices for controlling the devices such that a channel of each of the devices simultaneously conducts a current.

2. The circuit of claim 1, wherein the current-limiting circuit provides fault protection for power MOSFET devices having a fault-sensing circuitry by preventing the current from rising so high as to destroy a power MOSFET device before the fault-sensing circuitry can detect and interrupt the fault.

3. The circuit of claim 2, wherein an rdsON and power dissipation of the power MOSFET device during a conduction mode are increased.

4. The circuit of claim 1, wherein the MOS transistor has a source, a gate, a drain, and a body-drain junction and the bipolar transistor has a collector, a base, an emitter, and a base-emitter junction,
    wherein the base-emitter junction is coupled across the body-drain junction supporting a full applied drain voltage of the MOS transistor when the MOS transistor is in a blocking state and causing buildup of plasma of holes and electrons in a drain region.

5. The circuit of claim 4, wherein the channel forward biases a body-drain junction when a voltage drop on the channel reaches 0.7 to 0.8 volts.

6. The circuit of claim 5, wherein in each device, electrons diffuse into the base and are collected by the collector which is tied to the gate having an electrode.

7. The circuit of claim 5, wherein this current is directed to de-bias the gate, clamping voltage at the gate at the predetermined level and keeping the forward-conducting device from allowing the current to rise.

8. The circuit of claim 5, wherein the current through the reverse-conducting device limits the current by controlling a voltage at the gate of the forward-conducting device.

9. The circuit of claim 1, wherein the forward- and reverse-conducting devices are connected in series back-to-back.

10. A structure for use in limiting rising of a current above a predetermined level without using a separate current sensing resistor to sense the current, the structure comprising a device including a first MOS transistor, having a source, a gate, and a drain and including a bipolar transistor having a collector, a base, and an emitter,
    wherein ON-resistance of the first MOS transistor is used instead of the separate current-sensing resistor to sense the current in the first MOS transistor whereby a voltage developed across the ON-resistance will forward bias a base-emitter junction of the bipolar transistor when a reverse current flows through the first MOS transistor thereby to draw gate current away from a second series connected MOS transistor carrying a forward current to limit the current in the first and second series connected MOS transistors.

11. The structure of claim 10, wherein the device is formed on a silicon substrate having a drift region located between body and drain regions, the base and collector being located in the body region and the emitter being located in the drift region.

12. The structure of claim 11, wherein a portion of a signal on the gate is removed when the current at the drain is above the predetermined level, thereby preventing the current from rising.

13. The structure of claim 12, wherein the bipolar transistor turns on when the first MOS transistor carries a reverse current.

* * * * *